United States Patent [19]

Simpson et al.

[11] Patent Number: 4,910,115

[45] Date of Patent: Mar. 20, 1990

[54] LIGHT-SENSITIVE POLYMERIZABLE COMPOSITIONS CONTAINING SILVER COMPOUNDS

[75] Inventors: William H. Simpson, Centerville; Katherine A. Gyure, Miamisburg, both of Ohio

[73] Assignee: The Mead Corporation, Dayton, Ohio

[21] Appl. No.: 274,524

[22] Filed: Nov. 21, 1988

[51] Int. Cl.$^4$ ................................................ G03C 1/72
[52] U.S. Cl. ..................................... 430/138; 430/219; 430/203; 430/551; 430/613; 430/617; 430/619; 430/924
[58] Field of Search ............... 430/219, 203, 551, 138, 430/613, 617, 619, 924; 526/204

[56] References Cited

U.S. PATENT DOCUMENTS 2,928,375  3/1960  Barbier ................................. 430/551
4,147,552  4/1979  Specht et al. ........................ 430/152
4,842,977  6/1989  Kakimi ................................. 430/138

FOREIGN PATENT DOCUMENTS 0203613  3/1986  European Pat. Off. ............ 430/138

OTHER PUBLICATIONS

Research Disclosure, Dec. 1980, 20036, "Photopolymerizable Compositions Featuring Novel Co-Initiators", vol. 200.

Primary Examiner—Paul R. Michl
Assistant Examiner—T. Neville
Attorney, Agent, or Firm—Thompson, Hine and Flory

[57] ABSTRACT

A light-sensitive photohardenable composition comprising a reducing agent, a light-sensitive silver halide, a polymerizable compound, and a coumarin or a ketocoumarin.

20 Claims, 1 Drawing Sheet

LIGHT-SENSITIVE POLYMERIZABLE COMPOSITIONS CONTAINING SILVER COMPOUNDS

BACKGROUND OF THE INVENTION

The present invention relates to an improved photohardenable light-sensitive composition of the type including a light-sensitive silver halide, a developing agent, and a polymerizable compound wherein the composition further includes a coumarin or a ketocoumarin. It has been found that the coumarin or ketocoumarin reduces Dmin, improves the Dmax/Dmin ratio, increases the developing latitude of the composition, and improves image sharpness.

Light-sensitive compositions comprising a silver halide, a developing agent, and a polymerizable compound are known in the art. The compositions are image-wise exposed to form a latent image and then heated to polymerize the polymerizable compound. Depending upon the nature of the silver halide and the developer, the composition may be hardened in exposed or unexposed areas. These light-sensitive compositions are the subject of the following European Patent Publication Nos.: 0 203 613; 0 228 083; 0 234 580; and 0 228 053. European application No. 0 203 613 specifically relates to a photosensitive material in which the compositions are micro encapsulated with an image-forming agent.

One of the drawbacks of the aforementioned light-sensitive compositions is that they exhibit a comparatively high background density or Dmin. Another is that there can be significant variations in the quality of the images obtained with variations in the heating conditions used in developing the image. As the compositions are heated for increasing periods of time higher temperatures to polymerize the polymerizable compound, there is a reduction in sharpness and Dmax is observed to fall off rapidly. As a consequence of the high Dmin and falling Dmax, there is a very narrow window in which the materials can be heated to provide the maximum ratio of Dmax to Dmin. This detracts from the utility of the compositions.

SUMMARY OF THE INVENTION

In accordance with the present invention, it has been found that variations in image quality can be reduced and Dmin can be improved in the aforementioned light-sensitive materials if the light-sensitive composition additionally includes a coumarin or a ketocoumarin. In addition, many ketocoumarins are yellow in color and function as filter dyes for red and green light-sensitive compositions and thereby improve resolution.

Accordingly, the present invention in its simplest form provides a light-sensitive composition comprising a silver halide, a developing agent, a polymerizable compound, and coumarin or a ketocoumarin.

The present invention further provides a light-sensitive material wherein the aforementioned composition is provided on a support.

The present invention still further relates to a light-sensitive material wherein the aforementioned composition is microencapsulated with an image-forming agent as disclosed in U.S. Pat. Nos. 4,399,209 and 4,440,846 and European Published Application No. 0 203 613.

The present invention more particularly relates to a full color light-sensitive material wherein red, green, and blue light-sensitive compositions as described herein are used.

DETAILED DESCRIPTION

Figure 1:
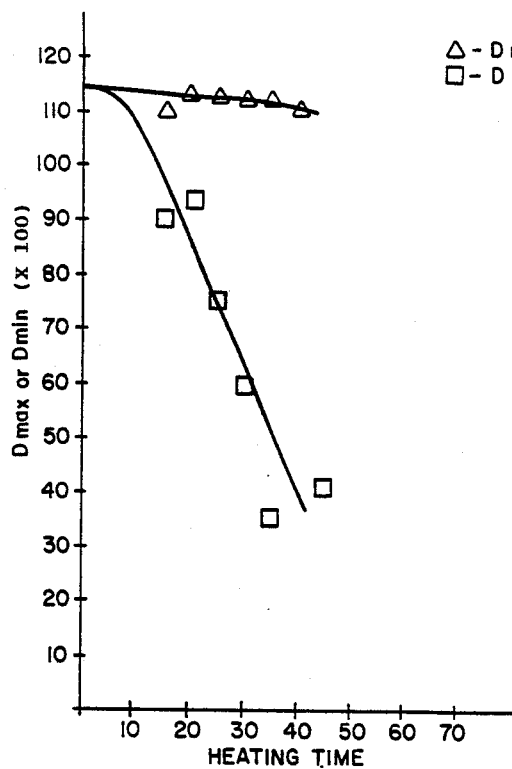
FIG. 1 is a graph of Dmin versus heating time for a light-sensitive composition not containing a ketocoumarin.

Coumarins and ketocoumarins useful in the present invention may be represented by the formula (I):

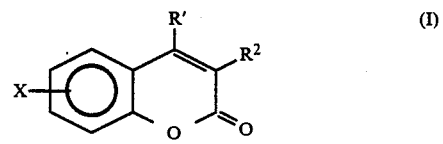

where X is a dialkylamino group such as a dimethylamino or a diethylamino group; $R^1$ is a hydrogen atom or a alkyl group having 1 to 4 carbon atoms such as a methyl group or an ethyl group and $R^2$ is a hydrogen atom, an alkyl group an aryl group or a group of the formula COY where Y is o-alkyl, o-aryl, hydrogen, alkyl, aryl,

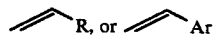

where R is alkyl and Ar is aryl; or the formula II:

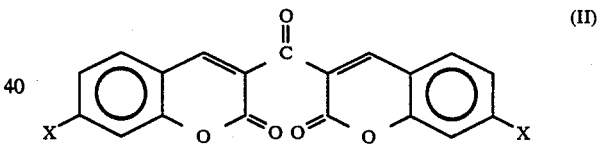

where X is defined as in formula (I). The term "alkyl" includes alkyl groups having 1 to 20 carbon atoms. The term "aryl" includes phenyl or napthyl or substituted phenyl or napthyl.

The coumarins and ketocoumarins used in this invention are preferably essentially water insoluble and soluble in monomer such as TMPTA in the amounts used herein at processing temperatures. Particularly preferred are compounds of the formula (I) or (II) where X is a diethylamino group, $R^2$ is COY, and Y is

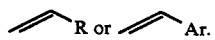

Specific examples of coumarins or ketocoumarins useful in the present invention are: 7-diethylamino-3-cinnamoyl coumarin, 3,3'-carbonyl bis(7-diethylamino coumarin) and N,N-diethylaminodaphnetin.

The coumarin or ketocoumarin is preferably incorporated into the photosensitive composition of the present invention in an amount of about 0.05 to 1% and preferably 0.1 to 0.3% based on monomer. The exact amount will vary with the solubility and extinction coefficient of the particular coumarin or ketocoumarin used.

DETAILED DESCRIPTION OF THE INVENTION

There is no specific limitation on the light-sensitive silver halides, developing agents, and polymerizable compound useful in the present invention. Examples have already been described extensively in the patent literature and examples are provided in the aforementioned published European applications which are incorporated herein by reference.

Representative examples of silver halides which may be used in the present invention include silver chloride, silver bromide, silver iodide, silver chlorobromide, silver chloroiodide, silver iodobromide and silver chloroiodobromide. The composition of the individual silver halide grains may be homogeneous or heterogeneous to form a core-shell construction. Tabular or uniform grains may be used. Two or more silver halides may be used in combination.

The silver halide grains may be prepared by any of a number of conventional processes, e.g., the acid process, neutral process or ammonia process. In the preparation of silver halide emulsions, hydrophilic colloids are preferably used. Examples of useful colloids include a gelatin and gelatin derivatives, cellulose derivatives, and polysaccharides such as sodium alginate and starch derivatives.

There is no specific limitation on the crystal habit of silver halide grains. Two or more kinds of silver halide grains which differ in halogen composition, crystal habit, grain size, and/or other features can be used in combination. There is no specific limitation on grain size distribution of silver halide grains. The silver halide grains ordinarily have a means size of 0.001 to 5$\mu$, more preferably 0.001 to 2$\mu$. The silver halides used in the present invention may be silver halides which form a latent image predominantly on the surface of the silver halide grain or silver halides which form a latent image predominantly in the interior of the grain.

There is no specific limitation with respect to the sensitizing yes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for super sensitization. In addition to the sensitizing dyes, a substance which does not per se exhibit spectral sensitization effect or does not substantially absorb visible light but shows supersensitizing activity can be used. The amount of the sensitizing dye generally ranges from about $10^{-8}$ to about $10^{-2}$ mol per 1 mol of silver halide. The silver halides are preferably spectrally sensitized with sensitizing dyes such as methine, cyanine, merocyanine and complex merocyanine dyes.

An organic silver salt can be used as an oxidizing agent in combination with the light-sensitive silver halide. The organic silver salt is believed to take part in a redox reaction using a silver halide latent image as a catalyst when heated to a temperature of 80° C. or higher. In such case, the silver halide and the organic silver salt preferably are located in contact with each other or in close association. Examples of organic compounds employable for forming such organic silver salt include aliphatic or aromatic carboxylic acids, thicarbonyl group-containing compounds having a mercapto group or an $\alpha$-hydrogen atom, imino group-containing compounds, and the like. Among them benzotriazoles are most preferable.

The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzorriazole) which can form an organic silver salt in combination with an inorganic silver salt can be added to he light-sensitive layer to obtain the same effect. The organic silver salt appears to react with the latent silver halide when heated. Typical examples of useful silver salts include silver behenate, silver stearate, silver tartrate, etc.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The developing (or reducing) agents used in the present invention include those conventionally used as silver halide developers. The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, amino reductones, o-or p-sulfonamidophenols, o-or psulfonamidonaphthols, 2-sulfonamidoindanones, 4-sulfonamido-5-pyrazolones,3-sulfonamidoindoles, sulfonamidopyrazolobenzimidazoles, sulfonamidopyrazolotriazoles, hydrazines, etc. Useful examples include beta-acetylphenylhydrazines such as beta-acetylphenylhydrazine, beta-acetyl-tolylhydrazine, beta-acetyl-p-methoxyphenylhydrazine, beta-acetyl-paminophenylhydrazine, 1-formyl-2-[4-(2-[2,4-di-tert-pentylphenoxy]butylamide)phenyl]hydrazine alkoxyphenols such as 2-phenyl sulfonylamino-4-hexadecyloxy-5-t-octylphenol etc. Particularly preferred developers ar hydrazines as described in European Publication No. 0 237 059. The developers can be used in combinations of two or more, if desired. The amount of the developer used can vary widely, but usually ranges from about 0.1 to 1500 mol % and preferably 10 to 300 mol % based on the silver salt.

Preferred examples of polymerizable compounds are ethylenically unsaturated compounds such as acrylic and methacrylic acid asters. Examples of compounds having an ethylenic unsaturated group include acrylic acid, salts of acrylic acid, acrylic esters, acrylamides, methacrylic acid, salts of methacrylic acid, methacrylic esters, mehhacrylamide, maleic anhydride, maleic esters, itaconic esters, styrene, styrene derivatives, vinyl ethers, vinyl esters, n-vinyl heterocyclic compounds, allyl ethers, allyl esters, and compounds carrying a group or groups corresponding to one or more of these compounds.

Examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylte, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Examples of the methacrylic esters include methyl methacrylate, butyl methacrylate, ethylene glycol dimethacrylate, butaediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A. Some particularly preferred polymerizable compounds are trimethylolpropane triacrylate and pentaerythritol tetraacrylate.

Polymerizable compounds may be used alone or in combinations of two or more. While the preferred polymerizable compounds are polyethyenically unsaturated compounds, monoethylenically unsaturated compounds such as acrylic and methacrylic acid may also be used. The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

The compositions of the present invention preferably include compounds which accelerate the oxidation-reduction reaction between the silver halide and/or the organic sliver salt and the developing agent. The most typical example of a useful accelerator is a base or a base precursor, i.e , a compound capable of releasing a base upon heating. The base and base precursor are preferably used in an amount of about 0.12 to 40% by weight based on the total amount of silver halide, silver salt, reducing agent and polymerizable compound.

In preparing the compositions of the present invention, it is desirable to add the developing agent and the coumarin or ketocoumarin to the polymerizable compound. If an image-forming agent is used with the composition, this compound too is preferably added to the polymerizable compound. Subsequently, the silver halide emulsion is dispersed in the polymerizable compound using a homogenizer, blender or similar mixer. To disperse the silver halide in the polymerizable material, it is desirable to use certain surface active agents and, more particularly, polymers having pendant hydrophilic groups terminated by hydroxyl or amino groups.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, these having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution and those capable of releasing bases by electrolysis. Preferred examples of the base precursors include guanidine trichloroacetate, piperidine trichloroacetate, morpholine trichloooacetate, p-toluidine trichloroacetate, 2-picoline trichloroacetate, guanidine phenylsulfonylacetate, guanidine 4-chlorophenylsulfonylacetate, guanidine 4-methylsulfonylphenylsulfonylaetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination. It is desirable to add the base or base precursor directly to the composition, however, this can diminish shelf life. Accordingly, when the composition is microencapsulated it is desirable to microencapsulate the base or base precursor separately or to coat it on the support separately. Upon heating the base migrates into the compositions and catalyzes development.

A particularly useful additive for enhancing contrast and sharpness is an antifogging agent or development accelerator. Useful compound are 5- or 6-membered heterocyclic compounds, thiourea derivatives and polyethylene glycol derivatives. Examples are provided in European Patent Application Publication No. 0 228 085.

Another useful additive is a hydrogen donor such as an N,N-dialkylaniline of the type conventionally used in photopolymerizable compositions. A particularly useful example is ethyl p-dimethylaminobenzoate (EPD).

Dispersing polymers having a principal chain consisting essentially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispersed state. Further, the polymer has another function of gathering silver halide along the interface between the polymerizable compound i.e., light-sensitive composition) and the aqueous medium in preparation of the microcapsule. Therefore, using this polymer, silver halide can be easily introduced into the shell material of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination.

The composition of the present invention can be used in a layer as a photoresist or they can be microencapsulated and used as described in U.S. Pat. Nos. 4,399,209 and 4,440,846. There is also no specific limitation on shell material of the microcapsule, and various known materials such as polymers which are employed in the conventional microcapsules can be employed as the shell material. The mean size of the microcapsule preferably ranges from 0.5 to 50μ, more preferably 1 to 25 most preferably 3 to 20μ. Some of the preferred methods are the formation of microcapsule walls from urea formaldehyde resin or melamine-formaldehyde resin by in situ polymerization or the formation of polyurethane or polyurea walls by interfacial condensation.

When the light-sensitive compositions of the present invention are microencapsulated, they are typically microencapsulated with an image-forming agent. The image forming agent may be a visible dye or pigment but is preferably a substantially colorless color former of the type conventionally used in carbonless paper. Representative examples of these compounds are known in the art and include compounds having a lactone, lactam, or spiropyran ring in their partial skeleton. The image forming materials are generally incorporated into the composition in an amount of about 0.1 to 50 parts by weight per 100 parts by weight of the polymerizable compound.

The light-sensitive compositions of the present invention, whether microencapsulated or not, can be coated on substantially any support material conventionally used in the photographic industry. Because the composition is heated to induce polymerization, the support should be formed from a heat resistant material. Useful supports include glass, paper, and synthetic films such as polyester, acetyl cellulose, cellulose ester, polyvinyl acetal, polystyrene, polycarbonate, polyethylene terephthalate, and paper laminated with resin or polymer (e.g., polyethylene).

Photosensitive compositions in accordance with the present invention are processed by image-wise exposing them to actinic radiation and preferably visible light. Any conventional means for exposure may be used for this purpose. Heat development can be conducted simultaneously with or subsequent to exposure. Heating can be conducted using such means as a heated platen, hot air, etc. Heating temperatures range from about 80° to 200° C. and preferably from about 100° to 160° C. for 1 second to 5 minutes and preferably 5 seconds to 1 minute.

When the photosensitive composition is used as a photoresist, the unpolymerized portions of the composition may be removed. Alternatively, the photosensitive composition can be used to immobilize an image-forming agent and an image can be formed on an image-receiving layer analogous to U.K. Pat. No. 1,141,475.

When the photosensitive composition is microencapsulated, images may be formed as described in U.S. Pat. Nos. 4,399,209; 4,440,846 and 4,562,137 to The Mead Corporation. It is particularly preferred to use the image-receiving (or developer) sheet described in U.S. application Ser. No. 073,036 filed July 14, 1987.

The present invention is illustrated in more detail by the following non-limiting example:

EXAMPLE

Under a safe light, 60 g TMPTA was heated to 90° C. and 0.1 g 7-diethylamino-3-cinnamoyl coumarin was added. The mixture was stirred for 15 minutes on a hot plate to allow the compound to dissolve in the TMPTA. The solution was allowed to cool to 60° C. and 1.0 g of ethyl-p-dimethylaminobenzoate (EPD) was dissolved in the TMPTA by stirring for 15 minutes on the hot plate at 60° C.

With the TMPTA solution at 60° C., 4.8 g of (55% solution) of a hydroxymethylmethacrylate-methacrylic acid copolymer (a silver halide dispersant) was added to the TMPTA and the solution was held 15 minutes. 6.0 g of the leuco dye color precursor was dissolved in the TMPTA solution and stirred for 30 minutes while maintaining the temperature at 60° C. with a water bath. 0.5 g Igepal CO-610 (nonylphenoxypoly(ethyleneoxy)ethanol a nonionic surfactant available from GAF) was weighed into a 250 cc glass beaker and the oil phase was added to the beaker. The beaker was placed on a hot plate and the oil phase was stirred and maintained at 60° C.

4.3 g 1-formyl-2-[4-(2-(2,4-di-tertpentylphenoxy)-butylamide)phenyl]hydrazine and 4.1 g 2-phenylsulfonyl-amino-4-hexadecyl-oxy-s-tert-octylphenol were dissolved in 13.2 g methylene chloride with sonification and the solution was added to the oil phase and stirred for 5 minutes. 10.0 g silver iodobromide emulsion and 120 mg benzotriazole were then emulsified into the oil phase by stirring at 15,000 rpm for 5 minutes while maintaining the temperature at 45° C. 3.0 g Takenate D110-N (a polyisocyanate available from Takeda Chemical Industries, LTD, Tokyo, Japan) was added to the emulsion and mixing was continued at 15,000 rpm for 1.5 minutes. The emulsion was then checked under a microscope at 400X to verify that the silver halide was uniformally dispersed therein.

82.0 g of the emulsion prepared above was emulsified into 125 g of a 10% solution of VERSA 502A (a sulfonated polystyrene available from National Starch) at 2200 rpm for 30 minutes at 40° C. to prepare a W/O/W emulsion. This emulsion was heated to 60° C. at 1000 rpm and maintained for 15 minutes. A solution of a melamine-formaldehyde (MF) prepolymer was prepared by adding 23 g melamine and 38 g formaldehyde (37% solution) to water and stirring at 600 rpm in 60° C. The pH of the solution was adjusted to 8.5 and the solution was allowed to cure for 1 hour. 43.5 g of the MF precursor was weighed into a heated beaker and added to the emulsion at 60° C., 1200 rpm. The pH was adjusted to 6.0 and the emulsion was covered and cured while stirring at 1000 rpm for 90 minutes. Urea 15.4 g (50%) was added to the emulsion with stirring for an additional 40 minutes. The microcapsule dispersion was allowed to cool and the pH was adjusted to 6.5-6.7 with stirring at 500 rpm. During preparation of the microcapsules, samples of the emulsion were tested for particle size at 20, 40 and 60 minutes after the addition of the MF prepolymer and for wall permeability at 5 and 40 minutes after addition of the prepolymer.

Using the identical procedure, a batch of control microcapsules was prepared without the ketocoumarin.

Preparation of Photosensitive Materials 10.0 g of the microcapsules prepared as above were mixed with 0.7 g sodium dodecyl sulfate (5%), 1.3 g starch (20%), in 3% PVA solution, 4.0 g guanidine trichloroacetate (2 g in 50/50 ethanol: water), a base precursor. The pH of the slurry was adjusted to 6.6 with 1% sodium hydroxide and the slurry was coated onto a developer sheet or PET base with a number 36 coating rod. The coated sheets were dryed at 50° C. for 1 hour, exposed and heat developed at 120° C. for 10–50 seconds.

Dmax and Dmin as a function of heating time are shown in Table 1 below for the control microcapsules and microcapsules containing the light-sensitive composition containing the ketocoumarins. These results are plotted in FIG. 1 for the control and FIG. 2 for the composition containing the ketocoumarin.

TABLE 1

| Heating Time Sec. | Control | | | Invention | | |
| --- | --- | --- | --- | --- | --- | --- |
| | Dmax | Dmin | Dmax/Dmin | Dmax | Dmin | Dmax/Dmin |
| 15 | 110 | 90 | 1.2 | 107 | 70 | 1.5 |
| 20 | 114 | 93 | 1.2 | 111 | 38 | 2.9 |
| 25 | 112 | 75 | 1.4 | 111 | 16 | 6.9 |
| 30 | 112 | 61 | 1.8 | 111 | 17.5 | 6.3 |
| 40 | 112 | 35 | 3.2 | 96 | 14 | 6.8 |
| 50 | 111 | 41 | 2.7 | — | — | |

Figure 2:
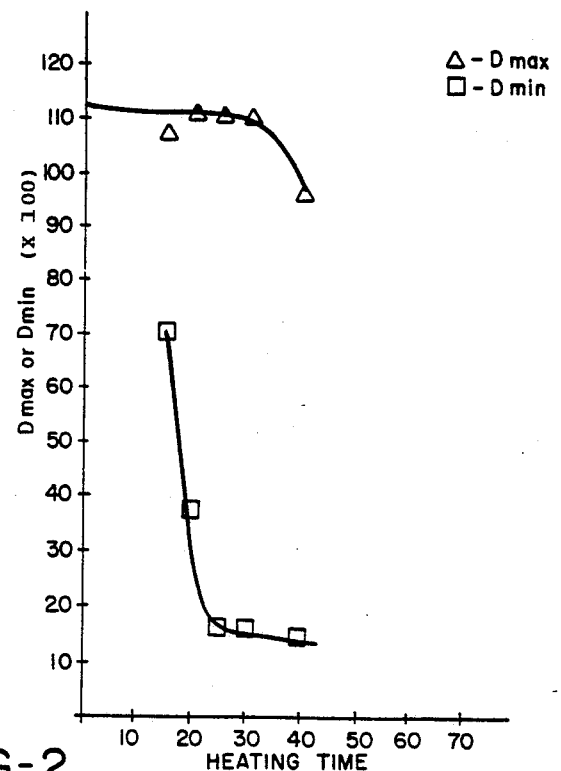
FIG. 2 is a graph of Dmin versus heating time for a light-sensitive composition in accordance with the present invention containing a coumarin or a ketocoumarin.

The results in Table 1 and FIGS. 1 and 2 show that a lower Dmin is achieved with the ketocoumarin. This in turn provides a much better Dmax/Dmin ratio and evidences the range of processing the photosensitive material.

Having described the invention in detail and by reference to specific embodiments thereof, it will be apparent that various changes and modifications can be made therein without departing from the spirit and scope of the following claims:

What is claimed is:

1. A light-sensitive composition comprising a reducing agent, a light-sensitive silver halide, a polymerizable compound, and a coumarin or a ketocoumarin.

2. The light-sensitive composition of claim 1 wherein said composition further contains an organic silver salt oxidizing agent.

3. The light-sensitive composition of claim 2 wherein said composition further includes a base precursor.

4. The light-sensitive composition of claim 2 wherein said composition further contains an image-forming agent.

5. The light-sensitive composition of claim 4 wherein said composition is encapsulated in a microcapsule.

6. The light-sensitive composition of claim 1 wherein said coumarin and said ketocoumarin are represented by the formula (I)

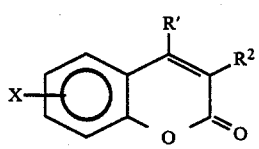

where X is a dialkylamino group, $R^1$ is a hydrogen atom or an alkyl group having 1 to 4 carbon atoms and $R^2$ is a hydrogen atom, an alkyl group, an aryl group, or a group of the formula COY where Y is hydrogen, alkyl, o-alkyl, o-aryl, aryl,

where R is alkyl and Ar is aryl, or the formula (II)

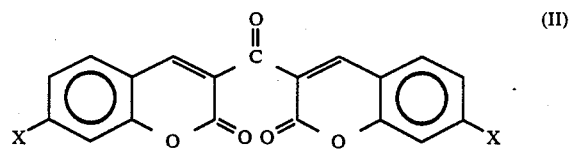

where X is defined as in formula (I).

7. The light-sensitive composition of claim 6 wherein $R^2$ is COY and y is

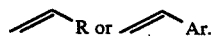

8. The light-sensitive composition of claim 7 wherein said coumarin or said ketocoumarin is selected from the group consisting of 7-diethylamino-3-cinnamoyl coumarin, 3,3'-carbonyl bis(7-diethylamino coumarin), and N, N-diethylaminodaphnetin.

9. The light-sensitive composition of claim 7 wherein said composition additionally contains a hydrogen donor.

10. A light-sensitive material comprising a support having a layer of a light-sensitive composition on the surface thereof, said light-sensitive composition including a light-sensitive silver halide, a polymerizable compound, a reducing agent and a coumarin or a ketocoumarin.

11. The light-sensitive material of claim 10 wherein said composition further contains an organic silver salt oxidizing agent.

12. The light-sensitive material of claim 11 wherein said composition further contains an image-forming agent.

13. The light-sensitive material of claim 12 wherein said composition is encapsulated in a microcapsule.

14. The light-sensitive material of claim 13 wherein said coumarin and said ketocoumarin are represented by the formula (I)

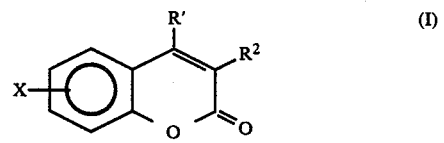

where X is a dialkylamino group, $R^1$ is a hydrogen atom or an alkyl group having 1 to 4 carbon atoms and $R^2$ is a hydrogen atom, an alkyl group, an aryl group, or a group of the formula COY where Y is hydrogen, alkyl, o-alkyl, o-aryl, aryl,

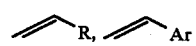

where R is alkyl and Ar is aryl, or the formula (II)

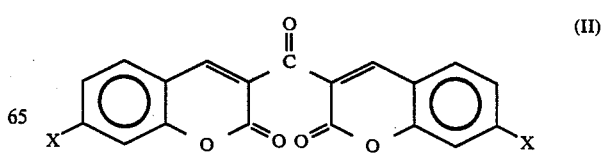

where X is defined as in formula (I).

15. The light-sensitive composition of claim 14 wherein $R^2$ is COY and Y is

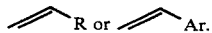

16. The light-sensitive material of claim 15 wherein said coumarin or said ketocoumarin is selected from the group consisting of 7-diethylamino-3-cinnamoyl coumarin 3,3'-carbonyl bis(7-diethylamino coumarin), and N, N-diethylaminodaphnetin.

17. The light-sensitive material of claim 15 wherein said composition additionally contains a hydrogen donor.

18. A light-sensitive material comprising a support having a layer of microcapsules on the surface thereof, said microcapsules including a first set of microcapsules sensitive to a first wavelength band of radiation, a second set of microcapsules sensitive to a second wavelength band of radiation, and a third set of microcapsules sensitive to a third wavelength band of radiation wherein at least one of said first, second and third sets of microcapsules is microcapsule containing a light-sensitive composition comprising a light sensitive silver halide, a polymerizable compound, a reducing agent and a coumarin or ketocoumarin.

19. The light-sensitive material of claim 18 wherein said first, second and third bands of radiation are, respectively, red, green, and blue light.

20. The light-sensitive material of claim 19 wherein said red-sensitive microcapsules contain a cyan image-forming agent, said blue-sensitive microcapsules contain a yellow image-forming agent, and said green-sensitive microcapsules contain a blue image-forming agent.

* * * * *